United States Patent
Horiuchi et al.

(10) Patent No.: US 6,953,255 B2
(45) Date of Patent: Oct. 11, 2005

(54) EDGE LIGHT FOR A LIGHTING PANEL

(75) Inventors: Megumi Horiuchi, Yamanashi-ken (JP); Masaaki Watanabe, Yamanashi-ken (JP)

(73) Assignee: Citizen Electronics Co., Ltd., Fujiyoshida (JP)

( * ) Notice: Subject to any disclaimer, the term of this patent is extended or adjusted under 35 U.S.C. 154(b) by 61 days.

(21) Appl. No.: 10/265,362

(22) Filed: Oct. 7, 2002

(65) Prior Publication Data

US 2003/0067761 A1 Apr. 10, 2003

(30) Foreign Application Priority Data

Oct. 9, 2001 (JP) ........................................ 2001-311974

(51) Int. Cl.[7] .............................................. F21V 21/00
(52) U.S. Cl. ........................... 362/31; 362/84; 362/256; 362/231; 362/249; 313/512; 313/511
(58) Field of Search ................................ 362/249, 800, 362/84, 256, 267, 231; 313/110, 511, 512

(56) References Cited

U.S. PATENT DOCUMENTS

| | | | |
|---|---|---|---|
| 6,345,903 B1 * | 2/2002 | Koike et al. | 362/249 |
| 6,578,989 B2 * | 6/2003 | Osumi et al. | 362/298 |
| 6,599,768 B1 * | 7/2003 | Chen | 438/22 |
| 6,850,001 B2 * | 2/2005 | Takekuma | 313/501 |

* cited by examiner

*Primary Examiner*—Thomas Sember
*Assistant Examiner*—Anabel Ton
(74) *Attorney, Agent, or Firm*—Dennison, Schultz, Dougherty & MacDonald

(57) ABSTRACT

A light emitting element is mounted on a substrate, a convex seal made of a transparent material is provided for sealing the light emitting element. The seal has a rectangular shape in plan view and has a convex shape. The convex shape of the seal has a first top in a direction of a long side of the rectangle, and has a second top in a direction of a short side of the rectangle, the first top has a first curved sectional shape, the second top has a second curved sectional shape, an average curvature of the first curved sectional shape is set to a value so that lightbeams discharged from the first top are expanded in the direction of the long side.

7 Claims, 5 Drawing Sheets

FIG. 7
PRIOR ART
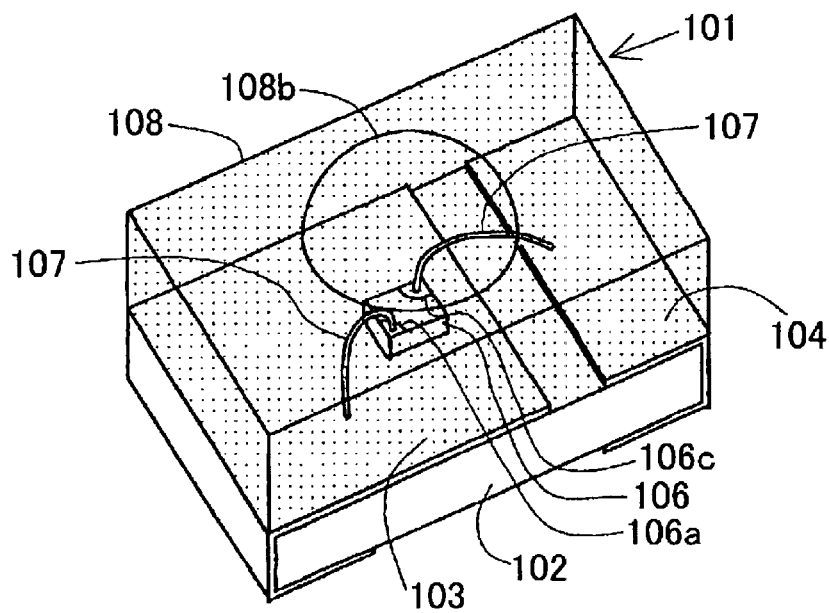
FIG. 8
PRIOR ART
FIG. 8a
PRIOR ART
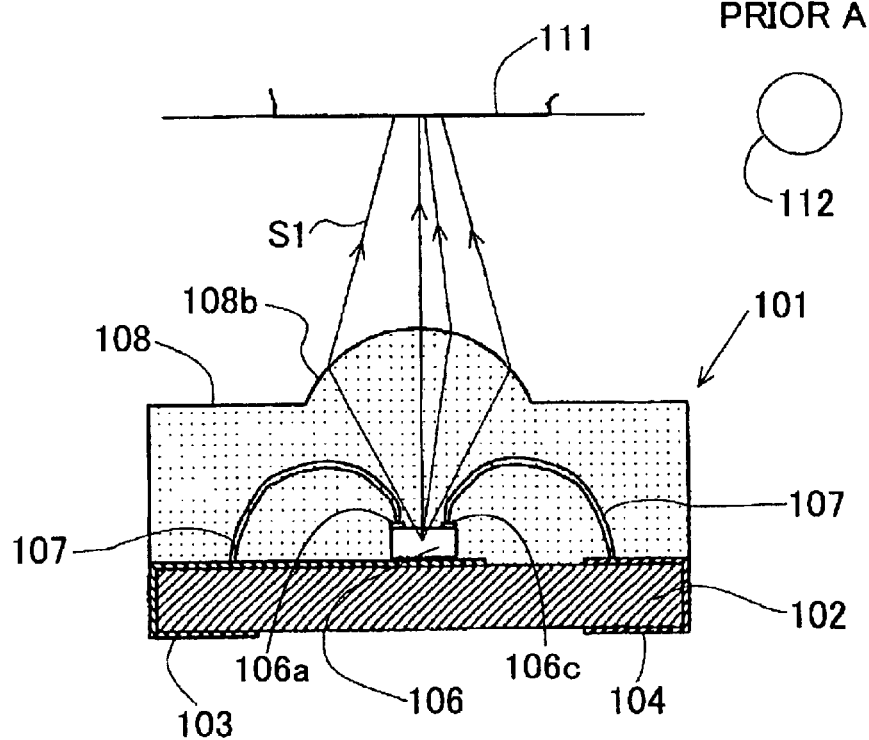

FIG. 9
PRIOR ART
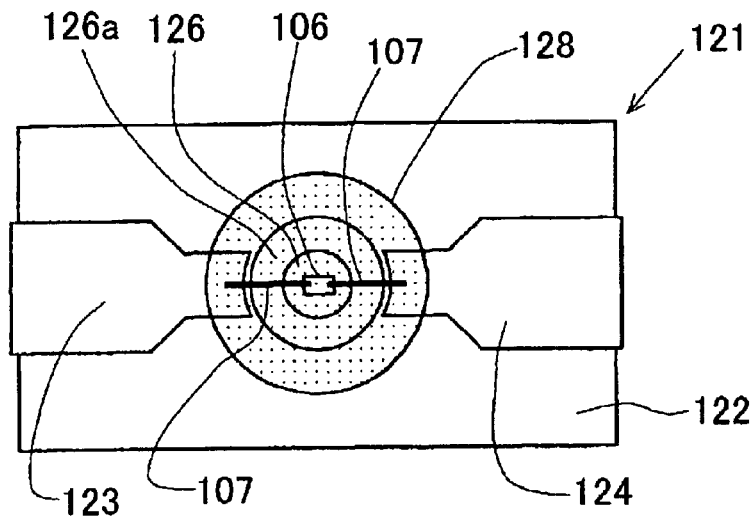
FIG. 10
PRIOR ART
FIG. 10a
PRIOR ART
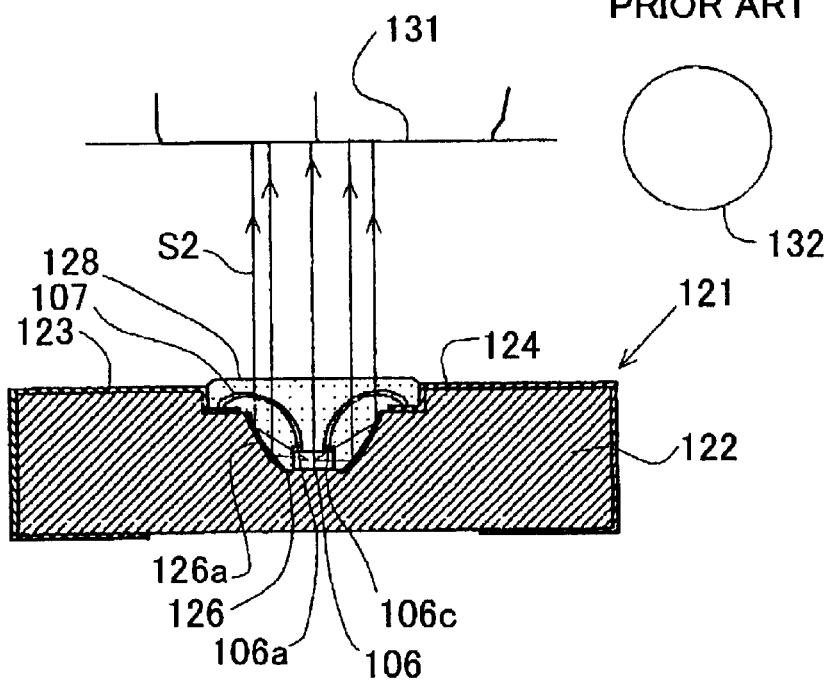

EDGE LIGHT FOR A LIGHTING PANEL

BACKGROUND OF THE INVENTION

The present invention relates to an edge light device for a lighting panel.

FIG. 7 is a perspective view showing a conventional edge light, and FIG. 8 is a sectional view of the edge light.

An edge light 101 comprises a substrate 102 made of glass epoxy resin, terminal electrodes 103 and 104 formed on the substrate 102 at the upper surface, sides and underside, and a light emitting diode 106 mounted on the terminal electrode 103. An anode 106a and cathode 106c are connected to the terminal electrodes 103 and 104 by bonding wires 107, respectively. The light emitting diode (hereinafter called LED) 106 and bonding wires 107 are sealed by a seal 108 made of transmissive resin.

On the surface of the seal 108, a convex lens 108b is formed above the LED 106.

When an electric current is applied to the LED 106 through the terminal electrodes 103 and 104 and bonding wires 107, the LED 106 emits light. Light beams which reach the convex lens 108b are refracted and discharged as light beams S1, and condensed to an annular spot 112 on a lighting panel 111 as shown in FIG. 8a.

FIG. 9 is a plan view showing another conventional edge light source, FIG. 10 is a sectional view of the edge light, and FIG. 10a is a plan view of a spot.

An edge light 121 comprises a substrate 122 having a recess 126 of a parabola sectional shape. On the other surface of the recess 126, a reflection film 126a is formed. Terminal electrodes 123 and 124 are formed on the substrate 122 at the upper surface, sides and underside. The LED 106 is securely mounted on the substrate 122. The anode 106a and cathode 106c are connected to the terminal electrodes 103 and 104 by bonding wires 107, respectively. The LED 106 and the bonding wires 107 are sealed by a seal 128.

When the LED 106 is operated, parallel light beams S2 are discharged and a spot 132 is formed on a lighting panel 131.

In order to use the edge light for illuminating a lighting panel for a liquid crystal device (LCD), there are following problems.

As described above, each of the edge lights 101 and 121 applies light beams to each lighting panel as a small annular spot. On the other hand, the lighting panel has a laterally elongated long side since the lighting panel has an upper panel surface having a large area for illuminating the LCD. Consequently, only one edge light can not illuminate a whole face of the side of the lighting panel at uniform brightness. Therefore, in order to light uniformly the side, a long edge light having a plurality of light sources must be disposed along the side. As a result, the cost for manufacturing the edge light increases.

SUMMARY OF THE INVENTION

An object of the present invention is to provide an edge light which may discharge light beams in a laterally elongated long range.

According to the present invention, there is provided an edge light for illuminating a panel comprising a substrate, a light emitting element mounted on the substrate, electrodes provided on the substrate and connected to the light emitting element for applying a current to the light emitting element, a convex seal made of a transparent material and sealing the light emitting element, wherein the seal has a rectangular shape in plan view, the convex shape of the seal has a first top in a direction of a long side of the rectangle, and has a second top in a direction of a short side of the rectangle, the first top has a first curved sectional shape, the second top has a second sectional shape, a curvature of the first curved sectional shape is set to a value so that light beams discharged from the first top are expanded in the direction of the long side.

The first curved sectional shape has a parabola or a circularly curved line.

The second top has a second top curved sectional shape, an average curvature of the first sectional shape is smaller than that of the second curved sectional shape so that light beams discharged from the first top are expanded in the direction of the long side.

These and other objects and features of the present invention will become more apparent from the following detailed description with reference to the accompanying drawings.

BRIEF DESCRIPTION OF DRAWINGS

FIG. 7 is a perspective view showing a conventional edge light;

FIG. 8 is a sectional view of the edge light;

FIG. 8a is a plan view of a spot;

FIG. 9 is a plan view showing another conventional edge light source;

FIG. 10 is a sectional view of the edge light; and

FIG. 10a is a plan view of a spot.

DETAILED DESCRIPTION OF THE PREFERRED EMBODIMENT

Figure 1:
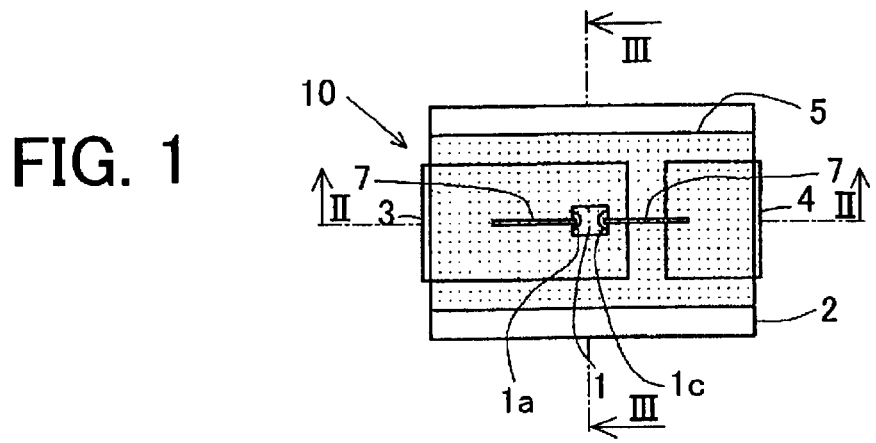
FIG. 1 is a plan view of an edge light according to a first embodiment of the present invention.
Figure 2:
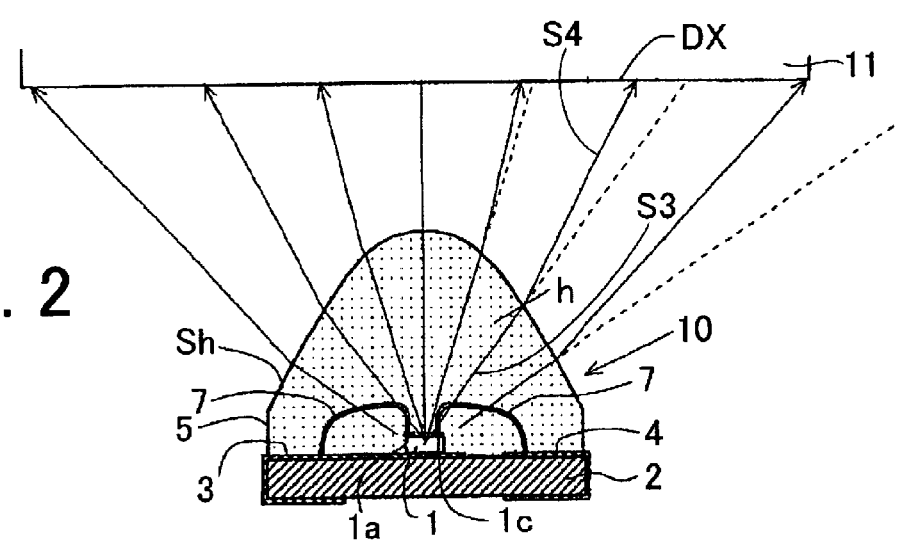
FIG. 2 is a sectional view taken along a line II—II of FIG. 1.
Figure 3:
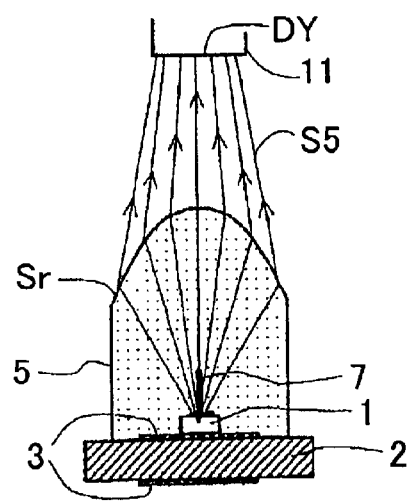
FIG. 3 is a sectional view taken along a line III—III of FIG. 1.

FIG. 1 is a plan view of an edge light according to a first embodiment of the present invention, FIG. 2 is a sectional view taken along a line II—II of FIG. 1, and FIG. 3 is a sectional view taken along a line III—III of FIG. 1.

An edge light 10 comprises a substrate 2 made of glass epoxy resin, terminal electrodes 3 and 4 formed on the substrate 2 at the upper surface, sides and underside, and a light emitting diode 1 mounted on the terminal electrode 3. An anode 1a and cathode 1c are connected to the terminal electrodes 3 and 4 by bonding wires 7, respectively. The light emitting diode (hereinafter called LED) 1 and bonding wires 7 are sealed by a convex seal 5 made of transmissive resin.

The seal 5 has a rectangular shape in plan view as shown in FIG. 1, a first top along the long side of the rectangle as shown in FIG. 2, and a second top along the short side of the rectangle as shown in FIG. 3. The first top has a sectional shape of a parabola Sh and the second top has a sectional shape of a curved line Sr. Each of the sectional shapes has a convex shape. Average curvature of the curved line Sr is larger than the average curvature of the parabola Sh.

When an electric current is applied to the LED 1 through the terminal electrodes 3 and 4 and bonding wires 7, the LED 1 emits light. Referring to FIG. 2, emitted light beams S3 reach the parabola top Sh, and are refracted and discharged as discharged light beams S4. The discharged light beams S4 are applied to a range DX of a long side of a lighting panel 11. The emitted light S3 is applied to the parabola top Sh from the lower side of a normal h, and discharged to the upper side of the normal h. If the seal 5 is not provided, the emitted light S3 is applied to the lighting panel 11 as shown by broken lines without being refracted. Consequently, there are light beams which are not applied to the lighting panel 11. Therefore, the quantity of light applied to the lighting panel 11 reduces compared with the present invention.

In the edge light of the present invention, since most of emitted lightbeams S3 are applied to the side of the lighting panel 11, the lighting effect increases. Furthermore, since the refracted light beams S4 do not diffuse, the lighting panel 11 is uniformly illuminated.

On the other hand, in the short side section shown in FIG. 3, discharged light beams S5 are condensed and applied to an area DY of the short side of the lighting panel 11 having a small width. Thus, the discharged light beams effectively strike the short side of the lighting panel 11. This is caused by the above described feature that the average curvature of the curved line Sr is set to a larger value than that of the parabola Sh.

Figure 4:
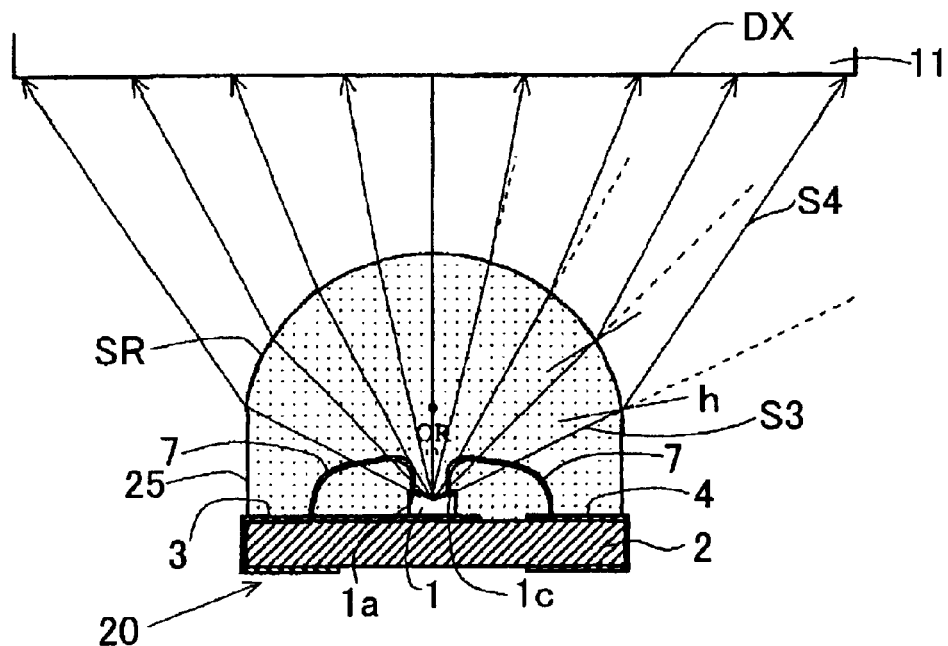
FIG. 4 is a sectional view of a second embodiment of the present invention, corresponding to FIG. 2 of the first embodiment.

FIG. 4 is a sectional view of a second embodiment of the present invention, corresponding to FIG. 2 of the first embodiment. A plan view and another sectional view are substantially same as FIGS. 1 and 3.

Since an edge light 20 has the same construction as the first embodiment except a seal, the same parts as the first embodiment are identified by the same reference numerals.

A seal 25 has a semi circular sectional shape top SR of a convex shape. The center OR of the circle SR is positioned above the LED 1.

When an electric current is applied to the LED 1, the LED 1 emits light. Emitted light beams S3 are refracted and discharged as discharged light beams S4. The discharged light beams S4 are applied to the range DX of the lighting panel 11.

The emitted light S3 is applied to the circular top SR from the lower side of the normal h, and discharged to the upper side of the normal h. Thus most of emitted light beams S3 strike the side of the lighting panel 11.

Figure 5:
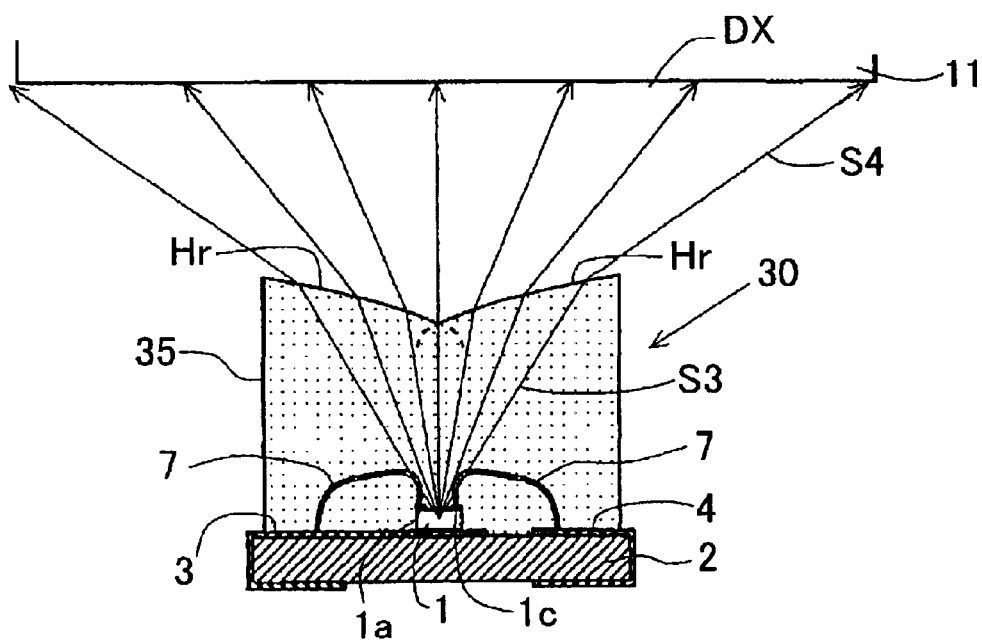
FIG. 5 is a sectional view of a third embodiment.

FIG. 5 is a sectional view of a third embodiment. Other figures are the same as FIGS. 1 and 3. A seal 35 of an edge light 30 has a top comprising a pair of convex parabolas Hr which are symmetrically disposed.

As shown in FIG. 5, the emitted light beams S3 is widely refracted as shown by discharge light beams S4. Thus, a long side of the lighting panel 11 can be illuminated.

Figure 6:
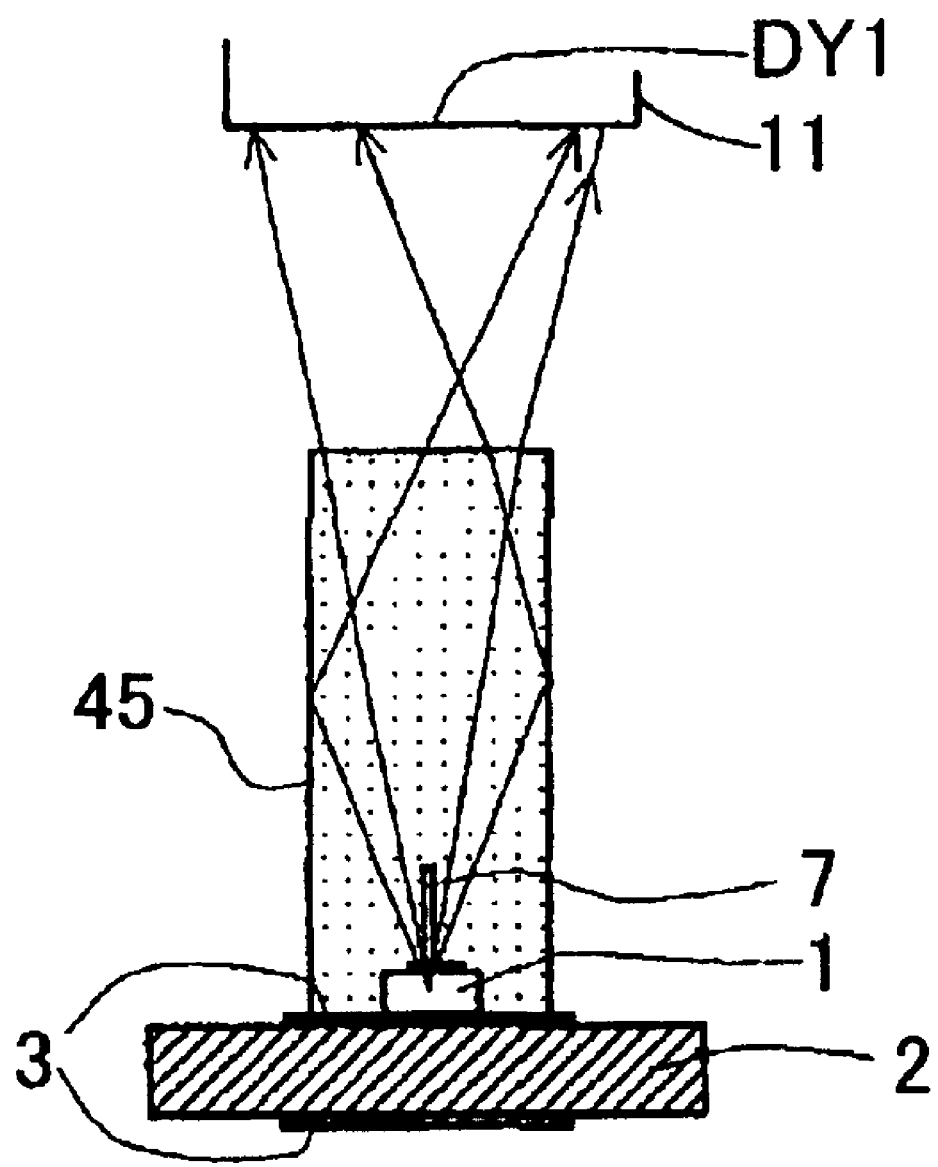
FIG. 6 is a sectional view of a modification of the first embodiment.

FIG. 6 is a sectional view of a modification of the first embodiment. The figure corresponds to FIG. 3, the plan view and the other sectional view are the same as FIGS. 1 and 2.

A seal 45 of an edge light 40 has a rectangular section in the short side of the rectangle in the plan view of FIG. 1. Emitted light beams S3 are directly applied to the short side of the lighting panel 11 or applied after being reflected by the sides of the seal 45. By properly reducing the width of the seal 45, the side of the lighting panel 11 is uniformly and brightly illuminated.

In accordance with the present invention, a long side of a panel can be uniformly and brightly illuminated. Consequently, the number of LEDs are reduced, thereby decreasing the manufacturing cost and reducing the size of the edge light.

While the invention has been described in conjunction with preferred specific embodiment thereof, it will be understood that this description is intended to illustrate and not limit the scope of the invention, which is defined by the following claims.

What is claimed is:

1. An edge light for illuminating a panel, comprising:

a substrate;

a light emitting element mounted on the substrate;

terminal electrodes provided on a surface of the substrate and connected to the light emitting element for applying a current to the light emitting element;

a convex seal made of a transparent material and sealing the light emitting element; wherein, each of the substrate and the convex seal has a rectangular shape in plan view;

the convex shape of the seal has a first top in a direction of a long side of the rectangular shape of the substrate, and has a second top in a direction of a short side of the rectangular shape of the substrate;

the first top has a first curved sectional shape;

the second top as a second sectional shape; and a curvature of the first curved sectional shape is set to a value so that light beams discharged from the first top are expanded from both end faces of a long side of the substrate, thereby radiating a beam of light of an inverted trapezoid in a sectional view having a long side longer than the long side of the rectangular shape of the substrate.

2. The edge light according to claim 1 wherein the first curved sectional shape has a parabola.

3. The edge light according to claim 1 wherein the first curved sectional shape has a circularly curved line.

4. The edge light according to claim 1 wherein the first curved sectional shape comprises a pair of parabolas.

5. The edge light according to claim 1 wherein the second top has a second curved sectional shape.

6. The edge light according to claim 1 wherein the second top has a straight line.

7. The edge light according to claim 5 wherein an average curvature of the first curved sectional shape is smaller than that of the second curved sectional shape so that the light beams discharged from the first top are expanded in the direction of the long side.

* * * * *

UNITED STATES PATENT AND TRADEMARK OFFICE
CERTIFICATE OF CORRECTION

PATENT NO. : 6,953,255 B2
DATED : October 11, 2005
INVENTOR(S) : Megumi Horiuchi et al.

It is certified that error appears in the above-identified patent and that said Letters Patent is hereby corrected as shown below:

<u>Column 4,</u>
Line 37, change "as" to -- has --.

Signed and Sealed this

Eighteenth Day of April, 2006

JON W. DUDAS
*Director of the United States Patent and Trademark Office*